United States Patent [19]

Konrad et al.

[11] 4,311,929
[45] Jan. 19, 1982

[54] SUMMING AMPLIFIER

[75] Inventors: William L. Konrad, Niantic; William L. Clay, Stonington, both of Conn.

[73] Assignee: The United States of America as represented by the Secretary of the Navy, Arlington, Va.

[21] Appl. No.: 108,857

[22] Filed: Dec. 31, 1979

[51] Int. Cl.³ .............. H03F 1/26; H03F 3/216; H03K 5/26
[52] U.S. Cl. .................. 307/529; 307/490; 332/16 T
[58] Field of Search .......... 307/262, 282, 216, 230, 307/232, 209, 490, 494, 529; 332/16 T, 21; 328/159

[56] References Cited

U.S. PATENT DOCUMENTS

| | | | |
|---|---|---|---|
| 2,937,342 | 5/1960 | Wellman | 332/16 T |
| 3,056,076 | 9/1962 | Hedgcock | 328/159 X |
| 3,673,506 | 6/1972 | Faulkner | 307/232 X |
| 4,121,118 | 10/1978 | Miyazaki | 307/262 X |

OTHER PUBLICATIONS

IBM Tech. Disclosure Bul. vol. 8, No. 8 Jan. 1966 pp. 1156–1157 "Inverse Exclusive-Or Circuit by Jen".

*Primary Examiner*—John S. Heyman
*Attorney, Agent, or Firm*—Robert F. Beers; Arthur A. McGill

[57] ABSTRACT

A summing amplifier which sums and amplifies two input signals and combines them in a single load or output device. It includes a bridge circuit using either 4 NPN or 4 PNP type transistors. Two transformers are used to achieve input relationship. A square wave of different frequency is applied to each of the two input terminals and the sum of the two input frequencies is converted to a three level waveform of constant amplitude but with on-time variations periodic at the difference frequency of the two input frequencies.

4 Claims, 2 Drawing Figures

SUMMING AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention generally relates to amplifying circuits and more particularly to a summing amplifier which adds and amplifies two input signals simultaneously. The usual method of amplifying signals from different sources is to combine them at low level stages of the amplifier. This method is generally useful and satisfactory for sine wave-like signals where either inter-modulation distortion is of little consequence or where such distortion can be minimized by careful circuit design. However, when it is necessary to minimize inter-modulation distortion and particularly where it is desirable to take advantage of the efficiency offered by switching on-off operation, the combining of signals at the amplifier input is at a disadvantage at high level operations. It is thus desirable to have a circuit design where the disadvantage of combining input signals at the amplifier input is overcome. Such a circuit is desirable for driving of a parametric acoustic source used for underwater communication wherein two frequencies must be simultaneously applied to a single source projector.

SUMMARY OF THE INVENTION

The summing amplifier according to the teachings of subject invention is a device which provides a simple means for summing and amplifying two input signals and comparing them in a single output load. The amplifier circuit includes a bridge circuit using either 4 NPN or 4 PNP type transistors. Two transformers are used to achieve input phase relationship. An input signal is either directly connected or transformer coupled. A square wave of a different frequency is applied to each of the two input terminals of the amplifier. The amplifier converts the sum of the two input signals of two different frequencies to a three-level waveform of constant amplitude but on-time variations periodic at the difference frequency of the two input frequencies. The constant amplitude characteristic of the output allows high efficiency to be achieved.

An object of subject invention is to have a device which can sum and amplify two input signals simultaneously.

Another object of subject invention is to have an amplifier wherein combining of signals at the amplifier input is free of the disadvantage of inter-modulation distortion commonly encountered in an amplifier.

Still another object of subject invention is to have an amplifier which makes use of constant amplitude characteristic of the output to achieve high efficiency.

Other objects, advantages and novel features of the invention will become apparent from the following detailed description of the drawings when considered in conjunction with the accompanying drawings wherein:

DESCRIPTION OF A PREFERRED EMBODIMENT

Figure 1:
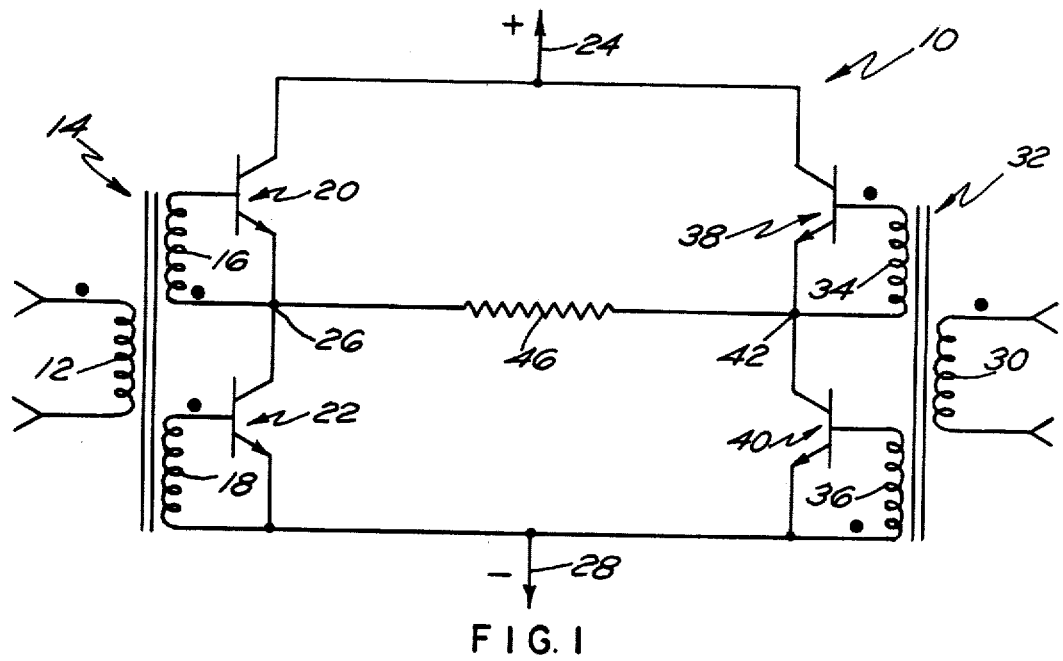
FIG. 1 is a block diagram of the circuit of a summing amplifier according to the teachings of subject invention.
Figure 2:
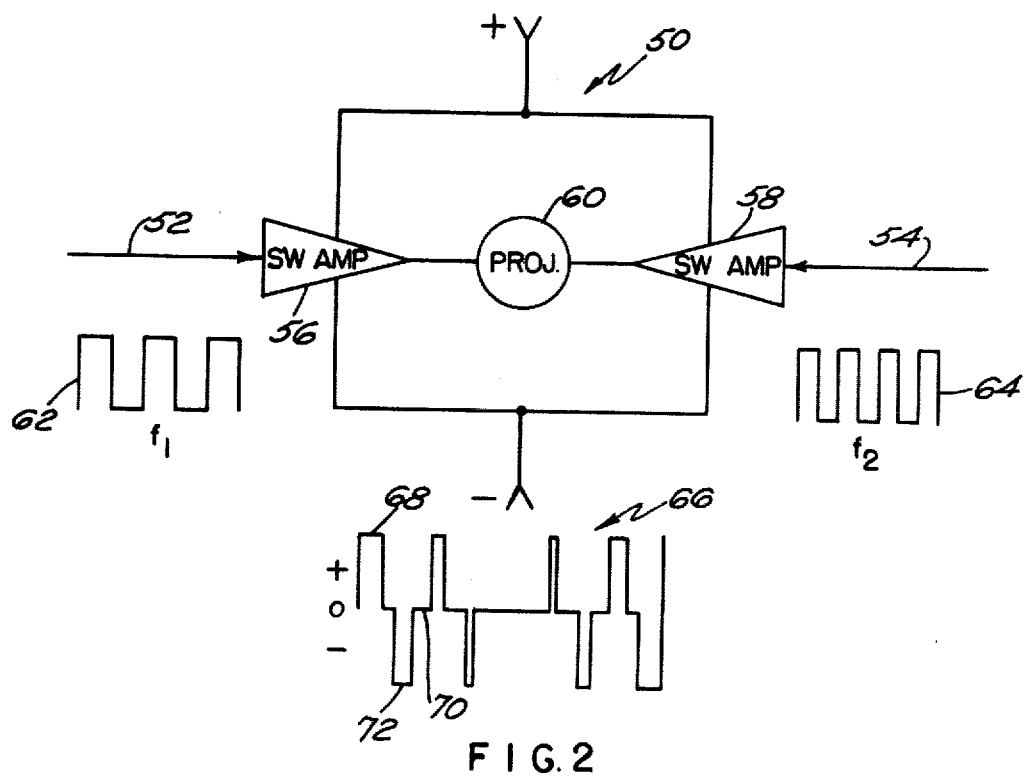
FIG. 2 is a graphical representation of the two inputs of the summing amplifier and the output across the output load thereof.

Referring to the drawing, FIG. 1 shows in a block diagram form the circuit of summing amplifier 10 built according to the teachings of subject invention. One of the two input signals having frequency $f_1$ is applied to the terminals of primary coil 12 of transformer 14 which has two secondary coils 16 and 18. One terminal each of the terminals of primary coil 12, secondary coil 16 and the secondary coil 18 of transformer 14 are dotted as shown in FIG. 1 and are connected in such a way that the terminals having a dot marked adjacent thereto have the same polarity (either negative or positive) resulting from the incoming input signal. The other, i.e., non-dotted, terminal of secondary coil 16 is connected to the base of transistor 20 and the other terminal, i.e., non-dotted, of secondary 18 is connected to the emitter of transistor 22. The emitter of transistor 20 is connected to the collector of transistor 22 to form junction point 26. The junction point 26 of the emitter of transistor 20 and collector of 22 is connected to the dotted terminal of secondary coil 16. The collector of transistor 20 is connected to the positive terminal 24 of a biasing power supply. The emitter of transistor 22 is connected to the other terminal, i.e., non-dotted, of secondary coil 18 and is also connected to the negative terminal 28 of the biasing power supply. The second input having frequency $f_2$ is connected to the terminals of primary coil 30 of transformer 32 which has secondary coils 34 and 36. The connections to the various coils of transformer 32 are made such that the dotted terminals of primary coil 30, secondary coil 34 and secondary coil 36, as shown in FIG. 1, swing together either positive or negative with the input signal of frequency $f_2$. The dotted terminal of secondary coil 34 is connected to the base of transistor 38 and the dotted terminal of secondary coil 36 is connected to the emitter of transistor 40. The emitter of transistor 38 and the collector of transistor 40 are connected together at junction point 42. The dotted terminal of secondary 36 is also connected to the negative terminal 28 of the biasing power supply. The other terminal, i.e., non-dotted of secondary 34 is connected to the junction 42 where the collector of transistor 40 and the emitter of transistor 38 join. The collector of transistor 38 is connected to the positive terminal 24 of the biasing power supply. The dotted terminal of secondary coil 36 and the emitter of transistor 40 are connected to the negative terminal 28 of the biasing power supply. A useful load such as a sound projector is connected across junctions 26 and 42. The output of summing amplifier 10 is taken across terminals 26 and 42. The shape of the input and output pulses is shown diagramatically in a graphical representation 50 of FIG. 2. The input 52 of frequency $f_1$ is applied to section 56 of the summing amplifier and input 54 of frequency $f_2$ is applied to section 58 of the summing amplifier and the output is taken across the useful load output load 60. The input 52 is of frequency $f_1$ and is a square wave pulse shown as 62 in FIG. 2 and input 54 of frequency $f_2$ is a square wave pulse is shown as 64 in FIG. 2. The output 66 of the summing amplifier, i.e., the variation of voltage across projector 60 is shown in FIG. 2. The maximum positive voltage 68 is shown in FIG. 2 together or with zero voltage level 70 and the maximum negative voltage 72 of the summing amplifier.

In operation, when the input signal of frequency $f_1$ is positive and the input signal of $f_2$ is negative, transistors 20 and 40 conduct, which turns terminal 26 positive and terminal 42 to be negative. This results in a positive voltage across the load 46 and which in turn gives level 68 shown in FIG. 2 for the output pulse. On the other hand, when input signal of frequency $f_1$ is negative and the input signal of frequency $f_2$ is positive, transistors 22 and 38 conduct which makes terminal 26 to be negative and terminal 42 of load 46 to be positive. This gives rise to the negative level 72 for the output pulse 66 as shown in FIG. 2. When both input signals are zero level this gives the output across terminal 26 and 42 of load 46 to be of zero level which is shown as level 70 in FIG. 2. The bridge circuit including transistors 20, 22, 38 and 40 gives rise to an arrangement whereby two input signals are summed and amplified and thus giving rise to an output signal across load 46 of FIG. 1. It should be noted that the transistors and transformers used in the above-described circuit are available commercially and can be substituted by other elements having equivalent characteristics.

Briefly stated, a summing amplifier for summing and amplifying two inputs simultaneously includes a bridge circuit and a pair of transformers. The summing amplifier sums two input signals and compares them in a single load device. The bridge circuit uses either 4 NPN or 4 PNP transistors. Input phase relationship is provided by the two transformers used. Square waves of different frequencies applied as different inputs are summed by the amplifier. The summing amplifier converts the sum of the two frequency signals to a three level waveform of constant amplitude but with an on-time variation periodic at the difference frequency of the two input frequencies.

Obviously, many modifications and variations of the present invention may become apparent in the light of the above teachings. As an example, the various transistor elements of the circuit can be interchanged without deviation from the teachings of subject invention. Furthermore, the coupling provided by a pair of transformers can be replaced by any other form of coupling. Furthermore, the bridge circuit of the amplifier can use 4 PNP transistors instead of 4 NPN transistors. Alternatively, the bridge circuit elements can be vacuum tubes or relays. It is therefore understood that within the scope of the appended claims the invention may be practiced otherwise than as specifically described.

We claim:

1. A summing amplifier for summing and amplifying at least two input signals at high levels which comprises:

means for coupling said input signals separately to said summing amplifier including a pair of transformers, each of said pair of transformers having the primary coil terminals thereof connected to one of said input signals and wherein the first transformer of said pair of transformers includes first and second secondary coils and the second transformer of said pair of transformers includes third and fourth secondary coils;

a bridge circuit for amplifying and combining said input signals wherein said bridge circuit includes a first pair of NPN transistors each having emitter, collector and base electrodes for amplifying one of said input signals and being connected to said first and second secondary coils of the first of said pair of transformers and a second pair of NPN transistors each having emitter, collector and base electrodes for amplifying the other of said input signals and being connected to said third and fourth secondary coils of the second of said pair of transformers; and output load means connected to said bridge circuit for obtaining the output of said summing amplifier.

2. The summing amplifier of claim 1 which has the base electrode of the first transistor of said first pair of NPN transistors being connected to one terminal of said first secondary coil, the collector electrode of the first of said first transistor pair of NPN transistors being connected to the positive terminal of a biasing supply and the emitter electrode of the first transistor of said first pair of NPN transistors being connected to the other terminal of said first secondary coil and being also connected to the collector electrode of the second transistor of said first pair of NPN transistors and and to a first terminal of said output load means, the base electrode of the second transistor of said first pair of transistors being connected to one end of said second secondary coil and emitter electrode of the second transistor being connected to the other end of said second secondary coil and to the negative terminal of said biasing supply.

3. The summing amplifier of claim 1 which has the base electrode of the first transistor of said second pair of NPN transistors being connected to one terminal of said third secondary coil, the collector electrode of the third transistor of said second pair of NPN transistors being connected to the positive terminal of said biasing supply, the emitter electrode of the third transistor of said second pair of NPN transistors being connected to the other terminal of said third secondary coil and to the second terminal of said output load means and also being connected to the collector electrode of the second transistor of said second pair of NPN transistors, one terminal of said fourth secondary coil being connected to the base electrode of the second transistor of said second pair of NPN transistors and the other terminal of said fourth secondary coil being connected to the emitter electrode of the second transistor of said second pair of NPN transistors and also to the negative terminal of said biasing supply.

4. The summing amplifier of claim 1 wherein said bridge circuit includes 4 PNP transistors.

* * * * *